(12) United States Patent
Kim

(10) Patent No.: US 11,234,348 B2
(45) Date of Patent: Jan. 25, 2022

(54) HEATSINK MODULE FOR INVERTER

(71) Applicant: LSIS CO., LTD., Anyang-si (KR)

(72) Inventor: Kyu-Hwa Kim, Anyang-si (KR)

(73) Assignee: LSIS CO., LTD., Anyang-si (KR)

( * ) Notice: Subject to any disclaimer, the term of this patent is extended or adjusted under 35 U.S.C. 154(b) by 0 days.

(21) Appl. No.: 16/539,619

(22) Filed: Aug. 13, 2019

(65) Prior Publication Data

US 2020/0232711 A1 Jul. 23, 2020

(30) Foreign Application Priority Data

Jan. 17, 2019 (KR) .................. 10-2019-0006156

(51) Int. Cl.
*H05K 7/20* (2006.01)
*F28F 3/06* (2006.01)
*F28D 1/02* (2006.01)

(52) U.S. Cl.
CPC .............. *H05K 7/209* (2013.01); *F28F 3/06* (2013.01); *H05K 7/20409* (2013.01); *F28D 1/0233* (2013.01); *F28F 2215/08* (2013.01); *F28F 2265/28* (2013.01)

(58) Field of Classification Search
CPC . F28D 1/0233; F28F 3/048; F28F 3/06; F28F 3/12; F28F 2215/08; F28F 2225/06; F28F 2265/28; F28F 2265/30; H01L 23/3672
See application file for complete search history.

(56) References Cited

U.S. PATENT DOCUMENTS

| 4,520,425 A | 5/1985 | Ito | |
| 5,937,517 A * | 8/1999 | Smith | F28F 3/02 |
| | | | 257/E23.102 |
| 6,545,872 B1 * | 4/2003 | Lonergan | H01R 12/721 |
| | | | 174/252 |
| 7,002,797 B1 | 2/2006 | Wittig | |
| 7,898,806 B2 * | 3/2011 | Isomoto | H05K 7/20918 |
| | | | 361/697 |

(Continued)

FOREIGN PATENT DOCUMENTS

| CN | 102594093 A | 7/2012 |
| CN | 102922107 A | 2/2013 |

(Continued)

OTHER PUBLICATIONS

European Search Report for related European Application No. 19190583.5; dated Feb. 20, 2020; (7 pages).

(Continued)

*Primary Examiner* — Eric S Ruppert
*Assistant Examiner* — Hans R Weiland
(74) *Attorney, Agent, or Firm* — K&L Gates LLP

(57) ABSTRACT

Proposed is a heatsink module for an inverter. The heatsink module includes a housing a bottom face, both spaced side walls, and both flanges. The heatsink module include a heat-dissipation plate including a base fixed to the both flanges; and a plurality of heat-dissipation fins extending downward from a bottom of the base. The heatsink module includes a supporter interposed between the bottom face of the housing and the heat-dissipation fins. The supporter has slots defined therein for accommodating at least portions of the heat-dissipation fins respectively.

5 Claims, 12 Drawing Sheets

(56) References Cited

U.S. PATENT DOCUMENTS

| | | | | |
|---|---|---|---|---|
| 8,499,824 B2* | 8/2013 | Peschl | | F28F 3/02 |
| | | | | 165/78 |
| 9,867,313 B2* | 1/2018 | Kuwahara | | H05K 7/20909 |
| 10,429,137 B2* | 10/2019 | Okuaki | | F28F 3/12 |
| 2002/0044424 A1* | 4/2002 | Hashimoto | | H01L 23/467 |
| | | | | 361/709 |
| 2002/0064028 A1 | 5/2002 | Nielsen et al. | | |
| 2006/0018096 A1 | 1/2006 | Chen et al. | | |
| 2007/0085763 A1 | 4/2007 | Jeong | | |
| 2008/0098750 A1* | 5/2008 | Busier | | F24H 4/04 |
| | | | | 62/3.3 |
| 2011/0013356 A1* | 1/2011 | Wang | | G06F 1/20 |
| | | | | 361/679.33 |
| 2011/0290455 A1* | 12/2011 | Tang | | H01L 23/467 |
| | | | | 165/121 |
| 2012/0262879 A1* | 10/2012 | Inoue | | H05K 7/20145 |
| | | | | 361/697 |
| 2013/0025837 A1 | 1/2013 | Takenaga | | |
| 2014/0036440 A1* | 2/2014 | Inoue | | H01L 23/467 |
| | | | | 361/692 |
| 2015/0062811 A1* | 3/2015 | Suzuki | | H05K 7/20918 |
| | | | | 361/690 |
| 2018/0132380 A1* | 5/2018 | Baran | | H05K 7/20918 |
| 2018/0279504 A1* | 9/2018 | Yoshikawa | | H05K 7/20918 |
| 2018/0324980 A1* | 11/2018 | Duong | | H05K 7/20409 |

FOREIGN PATENT DOCUMENTS

| | | | | |
|---|---|---|---|---|
| CN | 202906773 U | 4/2013 | | |
| CN | 104022659 A | 9/2014 | | |
| CN | 105047367 A | 11/2015 | | |
| CN | 205755134 U | 11/2016 | | |
| CN | 206180819 U | 5/2017 | | |
| CN | 107678498 A | 2/2018 | | |
| CN | 207968530 U | 10/2018 | | |
| CN | 208285720 U | 12/2018 | | |
| CN | 208316581 U | 1/2019 | | |
| EP | 1628514 A1 | 2/2006 | | |
| JP | 2007134471 A | * | 5/2007 | H05K 7/20918 |
| JP | 2016166000 A | 9/2016 | | |
| JP | 2018174611 A | 11/2018 | | |

OTHER PUBLICATIONS

Chinese Office Action for related Chinese Application No. 201910871779.7; action dated Sep. 8, 2021; (9 pages).

* cited by examiner

[FIG. 1]
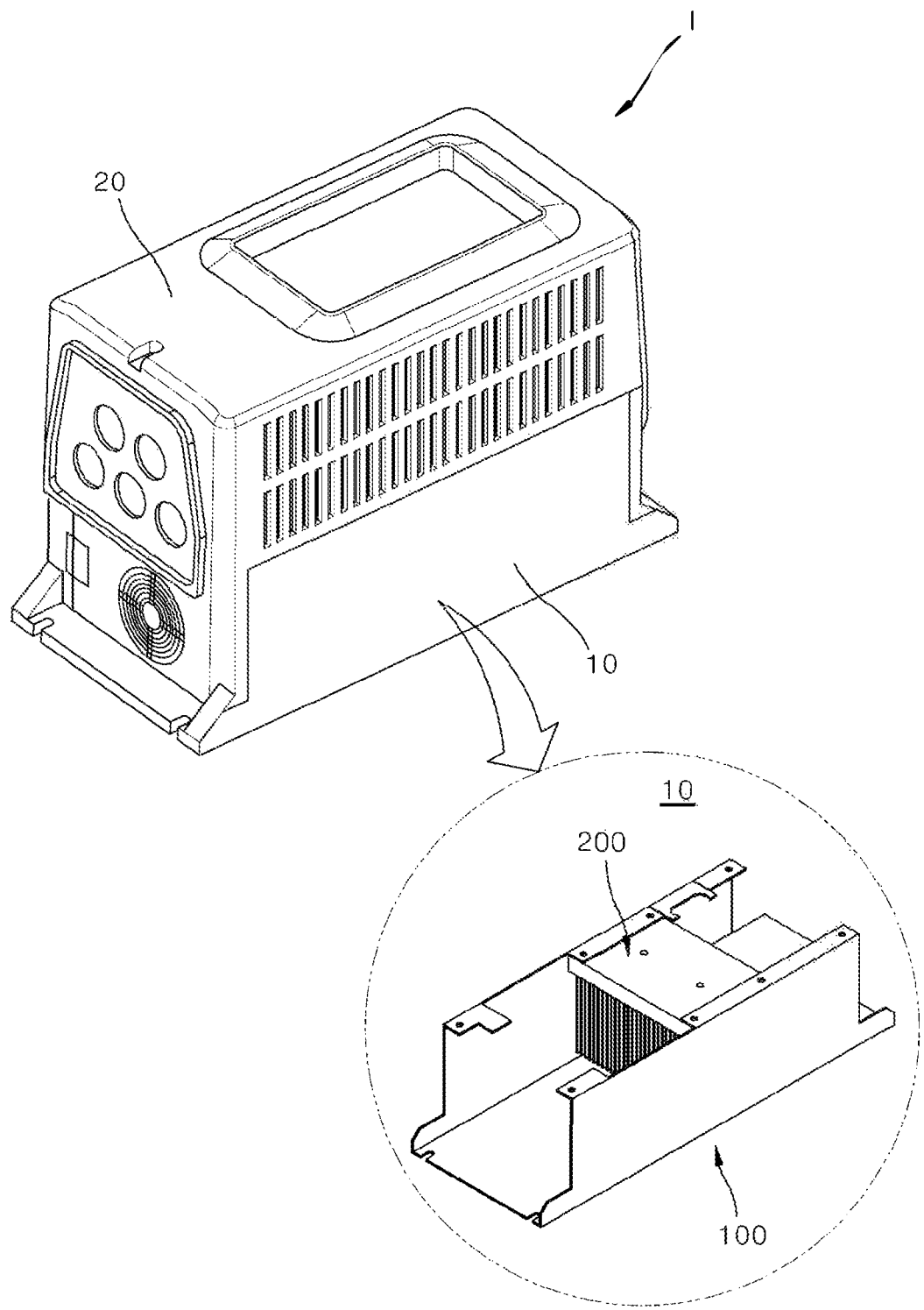

[FIG. 2]
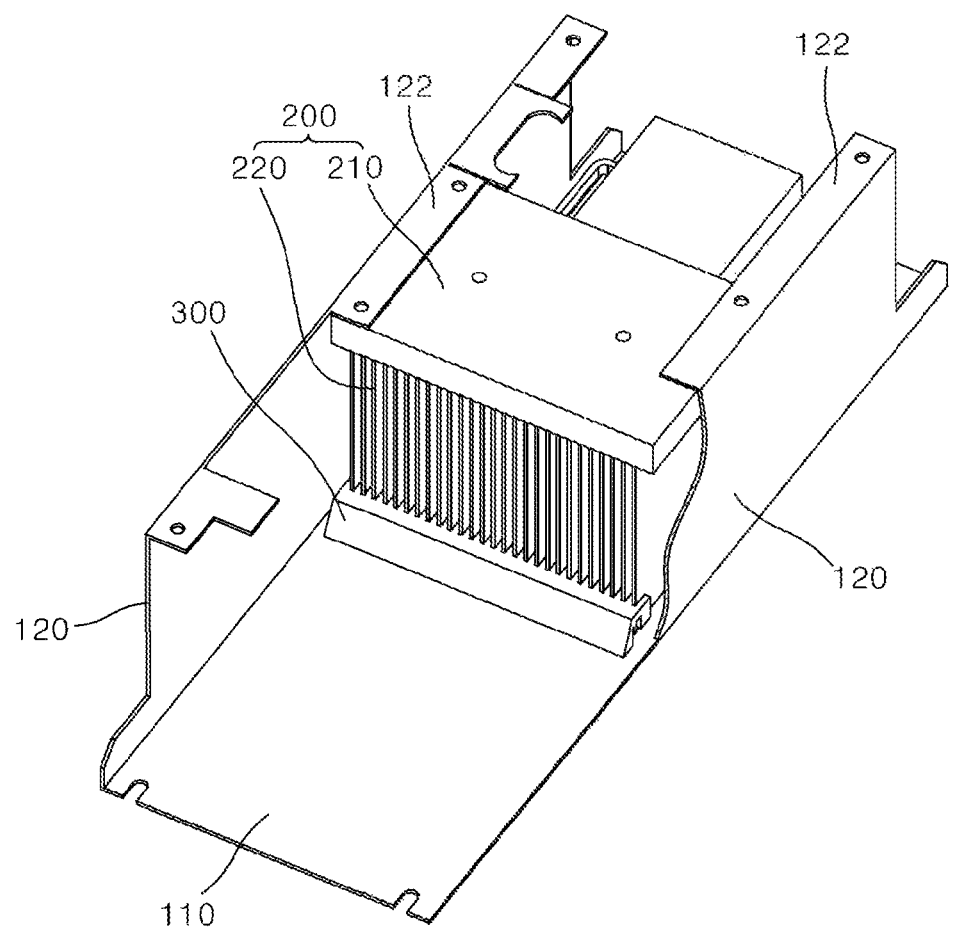

[FIG. 3]
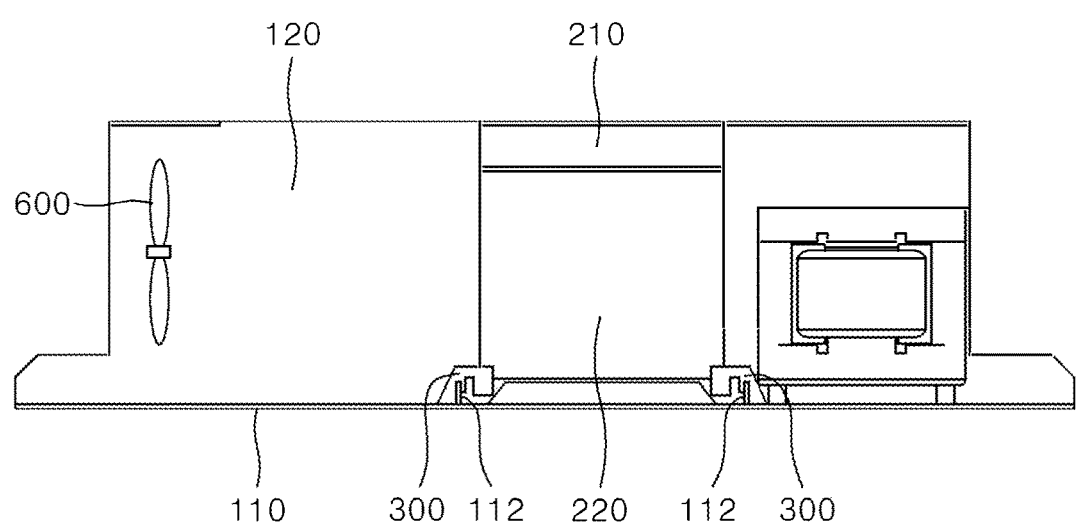

[FIG. 4]
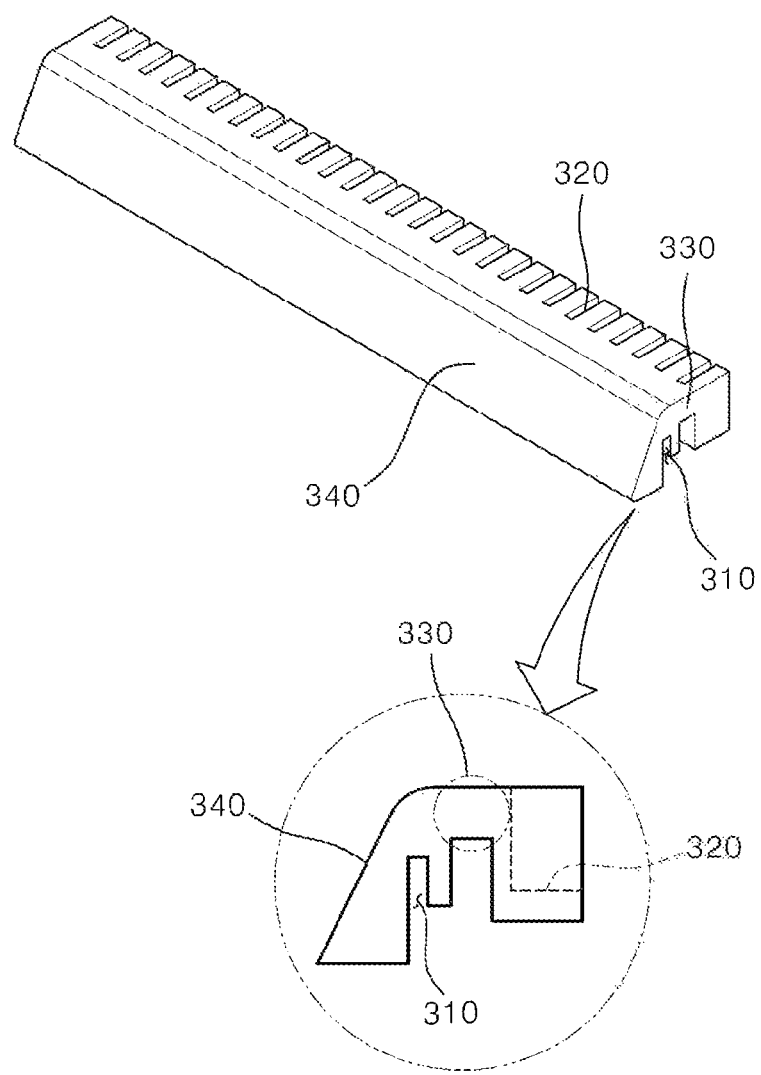

[FIG. 5]
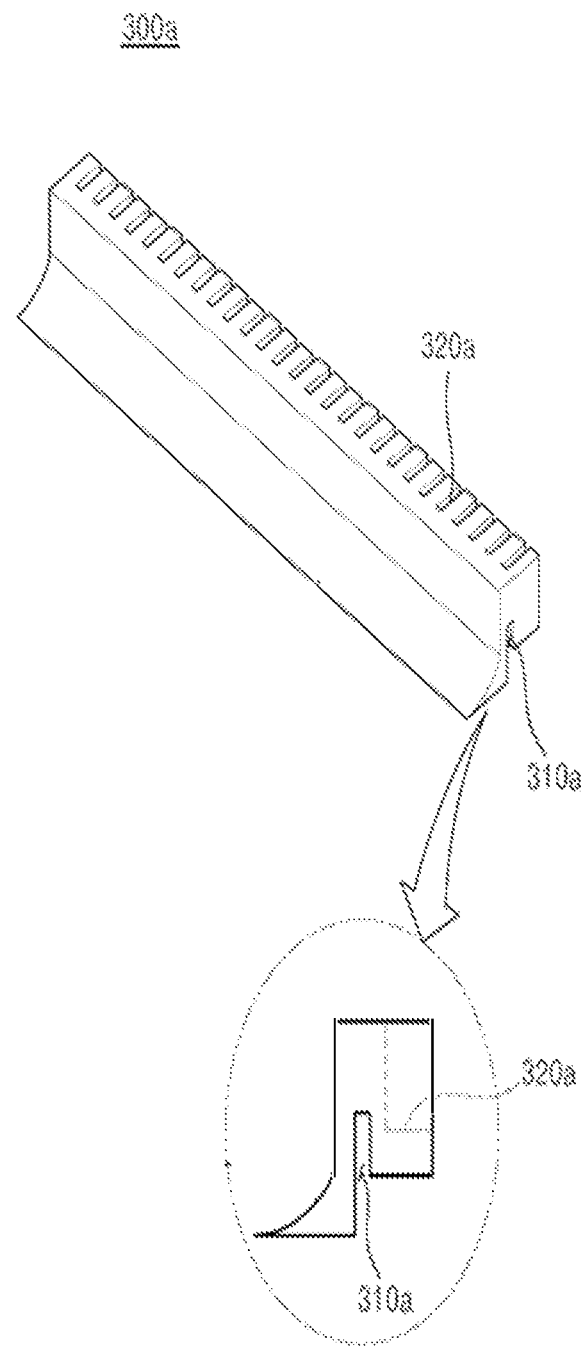

[FIG. 6]
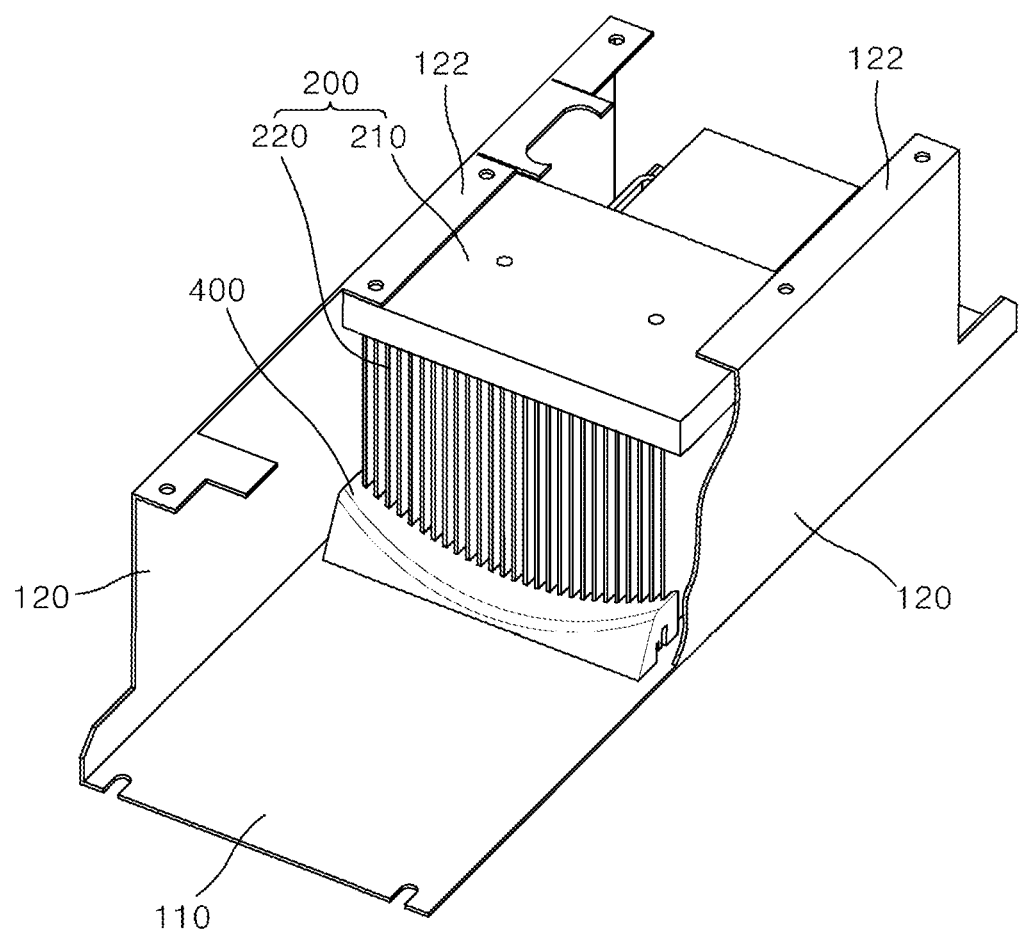

[FIG. 7]
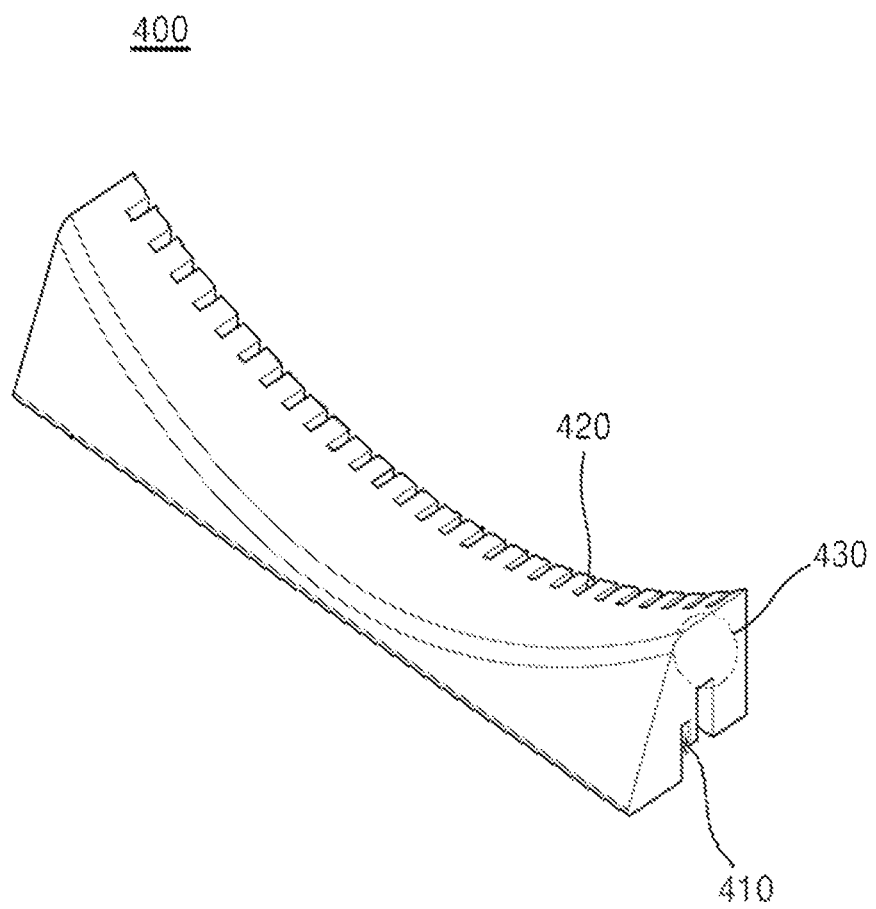

[FIG. 8]
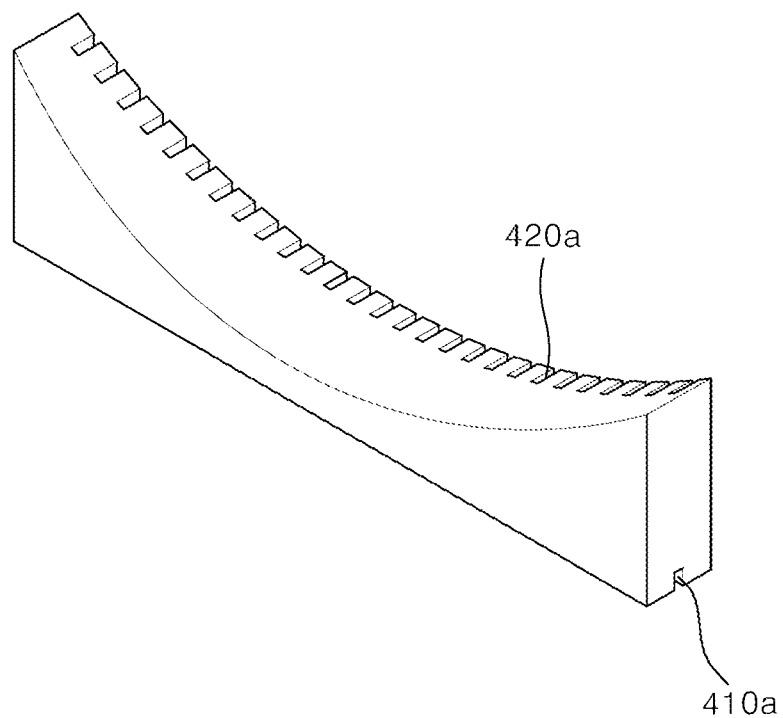

[FIG. 9]
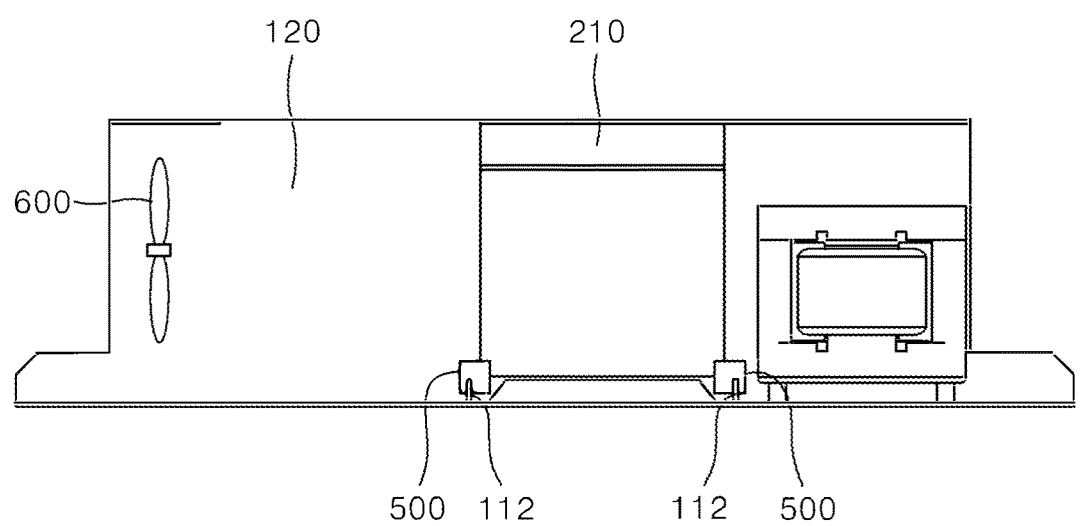

[FIG. 10]
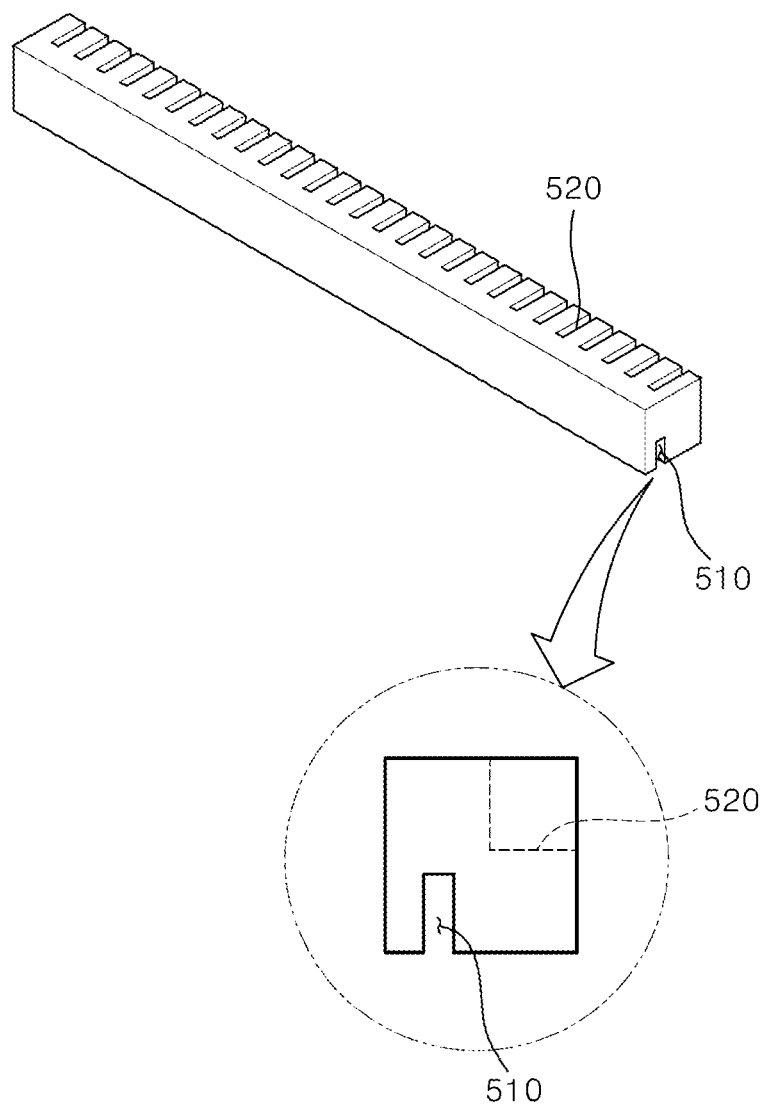

[FIG. 11]
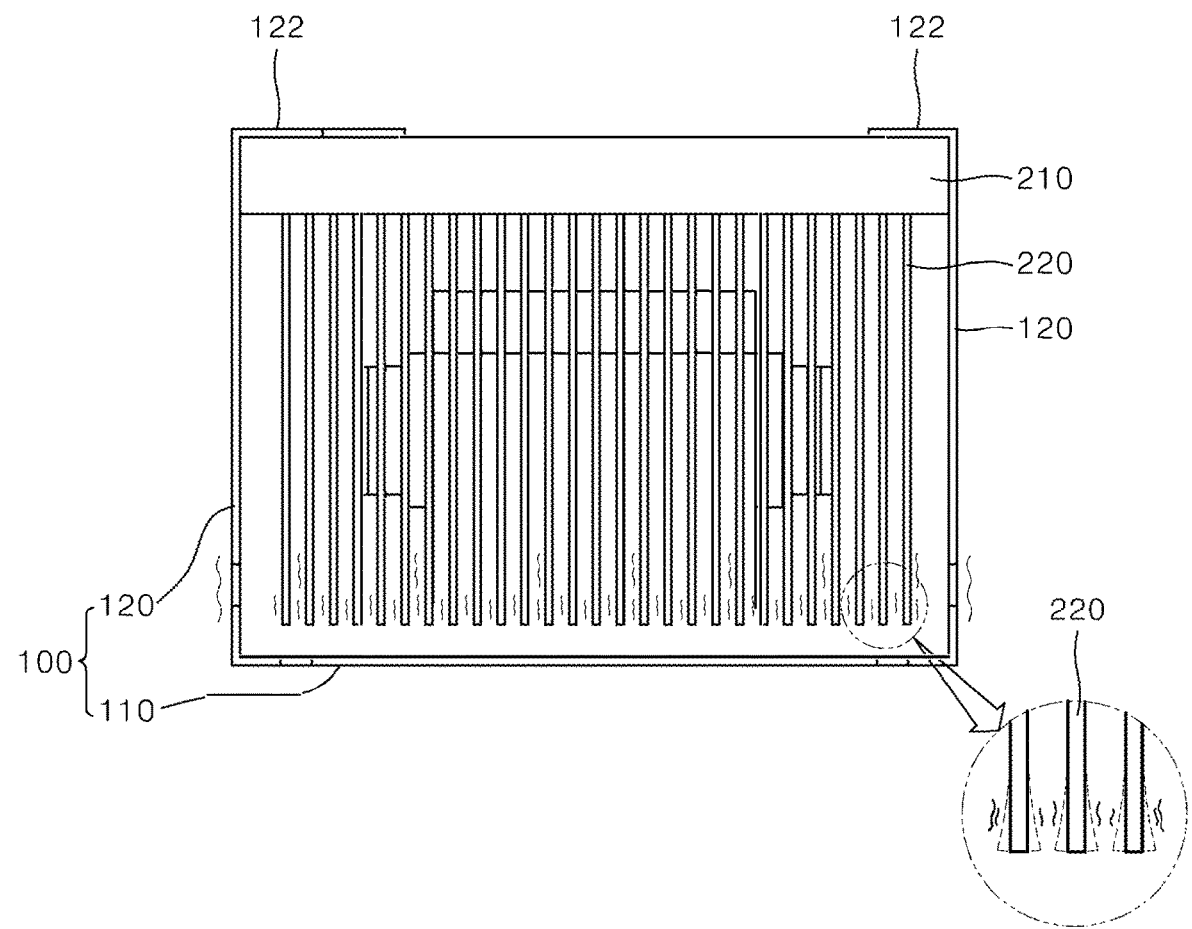

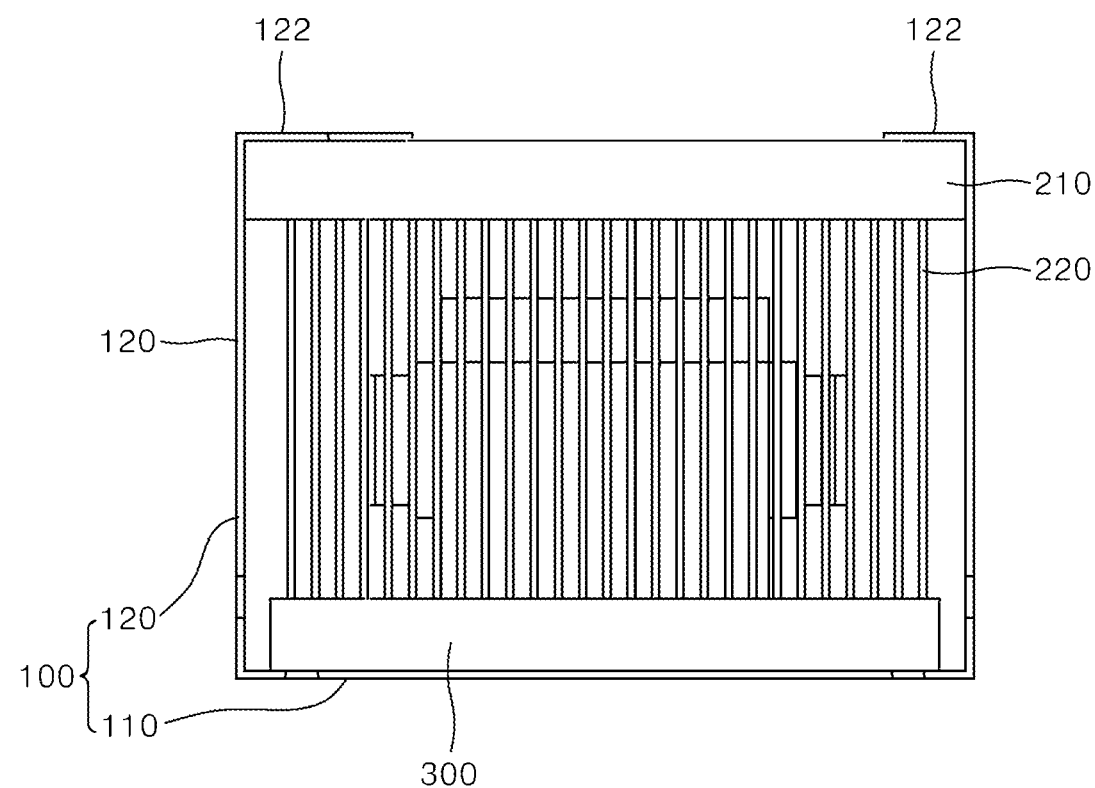
[FIG. 12]

HEATSINK MODULE FOR INVERTER

CROSS-REFERENCE TO RELATED APPLICATIONS

Pursuant to 35 U.S.C. § 119(a), this application claims the benefit of earlier filing date and right of priority to Korean Application No. 10-2019-0006156 filed on Jan. 17, 2019, in the Korean Intellectual Property Office, the disclosure of which is hereby incorporated by reference in its entirety.

BACKGROUND

1. Technical Field

The present disclosure relates to a heatsink module for an inverter.

2. Description of the Related Art

An inverter, commonly referred to as an inverting device converts DC power into AC power.

Generally, a main body of the inverter includes terminals for input and output, a controller, a display for displaying information, a power module for power supply, a capacitor for power interruption, and various circuit boards.

Various components are complexly arranged inside a narrow main body of the inverter. Components such as the power module and the capacitor have high heat generation during operation. Therefore, a separate heatsink module is built in or coupled to the inverter. The heatsink module includes a heat-dissipation plate made of a material with a high thermal conductivity. The heat-dissipation plate absorbs heat from the main body and dissipates the heat to a surrounding area.

The heat-dissipation plate contains a number of heat-dissipation fins. Generally, the heat-dissipation fins are formed by spacedly arranging several thin sheet-like members having high thermal conductivity in parallel with each other. This configuration is to widen a contact area between the heat-dissipation fins and air circulating around the fins.

However, generally, the main body is connected to a top of the heatsink module for the inverter. The main body is heavy compared with the heatsink module and vibrates during operation. The heatsink module has a minimal skeletal structure to improve air flowability in an internal space thereof and thus is structurally unstable and vulnerable to the vibration.

Further, as the heatsink module vibrates during operation, the heat-dissipation fins interfere with an adjacent housing to generate noise. Further, due to such interference, breakage or deformation of the heatsink module may occur.

Therefore, means for solving such problems is required.

SUMMARY

The present disclosure is directed to solving the problems of the prior art as described above. A purpose of the present disclosure is to provide a heatsink module for an inverter which reduces noise and vibration generated from the heat-dissipation fins in the heatsink module for the inverter.

Purposes of the present disclosure are not limited to the above-mentioned purpose. Other purposes and advantages of the present disclosure as not mentioned above may be understood from following descriptions and more clearly understood from embodiments of the present disclosure. Further, it will be readily appreciated that the purposes and advantages of the present disclosure may be realized by features and combinations thereof as disclosed in the claims.

In a one aspect of the present disclosure, there is proposed a heatsink module for an inverter, wherein the module is configured to dissipate heat generated from a main body of the inverter. The heatsink module comprises a housing having: a bottom face; both spaced side walls vertically extending from both sides of the bottom face respectively; and both flanges horizontally and inwardly extending from tops of both side walls respectively. The heatsink module comprises a heat-dissipation plate including a base fixed to the both flanges; and a plurality of heat-dissipation fins extending downward from a bottom of the base. The heatsink module comprises a supporter interposed between the bottom face of the housing and the heat-dissipation fins, wherein the supporter has slots defined therein for accommodating at least portions of the heat-dissipation fins respectively.

In one implementation, a fixed rail is formed on the bottom face of the housing, wherein the fixed rail is engaged with the supporter to restrict a movement of the supporter.

In one implementation, a rail groove is defined in a bottom of the supporter, wherein the rail groove has a shape corresponding to a shape of the fixed rail such that the fixed rail is press-fitted into the rail groove.

In one implementation, the supporter further includes an elastic portion formed between the rail groove and the slots and made of an elastic material, wherein when the heat-dissipation fins are engaged with the slots, the elastic portion elastically supports the slots so that the slots presses the heat-dissipation fins.

In one implementation, the supporter is supported on the fixed rail and is spaced by a predetermined distance from the bottom face.

In one implementation, the supporter has a concave curved top face such that a height thereof gradually increases from a longitudinal center thereof to each of both longitudinal ends thereof.

In one implementation, the supporter further includes a guide surface opposite to the slots and inclined at a predetermined angle.

Effects of the present disclosure are as follows but are not limited thereto.

The heatsink module for the inverter in accordance with the present disclosure has an effect of reducing the noise and vibration generated from the heat-dissipation fin inside the heatsink module.

Further, air passing through between the heat-dissipation fins is concentrated on a center portion across the heat-dissipation fins due to the shape of the supporter. Thus, a larger amount of air flows to the center portion having a relatively high temperature across the heat-dissipation fins, such that the heat dissipation efficiency of the heat-dissipation fins increases.

In addition to the effects as described above, specific effects of the present disclosure are described together with specific details for carrying out the invention.

BRIEF DESCRIPTION OF THE DRAWINGS

FIG. 1 shows a heatsink module connected to a bottom of a main body of an inverter.

FIG. 2 is a perspective view of a heatsink module for an inverter according to a first embodiment of the present disclosure.

FIG. 3 is a schematic cross-sectional view showing an internal arrangement of the heatsink module for an inverter according to the first embodiment of the present disclosure.

FIG. 4 is a cross-sectional view of a supporter of the heatsink module for an inverter according to the first embodiment of the present disclosure.

FIG. 5 is a perspective view and a side elevation view showing a supporter of a heatsink module for an inverter according to a second embodiment of the present disclosure.

FIG. 6 is a perspective view a state in which a supporter is coupled to a heatsink module for an inverter according to a third embodiment of the present disclosure.

FIG. 7 is a perspective view of the supporter in the heatsink module for an inverter according to the third embodiment of the present disclosure.

FIG. 8 is a perspective view of a supporter in a heatsink module for an inverter according to a fourth embodiment of the present disclosure.

FIG. 9 is a schematic cross-sectional view showing an internal arrangement of a heatsink module for an inverter according to a fifth embodiment of the present disclosure.

FIG. 10 is a perspective view and a side elevation view of a supporter in the heatsink module for an inverter according to the fifth embodiment of the present disclosure.

FIG. 11 is a front view of a conventional heatsink module showing a vibration state of the conventional heatsink module.

FIG. 12 is a front view of a heatsink module for an inverter according to the present disclosure.

DETAILED DESCRIPTIONS

For simplicity and clarity of illustration, elements in the figures are not necessarily drawn to scale. The same reference numbers in different figures denote the same or similar elements, and as such perform similar functionality. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a heatsink module for an inverter according to each of some embodiments of the present disclosure is described.

FIG. 1 shows a heatsink module connected to a bottom of a main body of an inverter.

A heatsink module 10 according to the present disclosure is applied to an inverter I which converts DC power into AC power.

As shown in FIG. 1, the inverter I includes and a main body 20. The heatsink module 10 is coupled to the main body 20. The main body 20 contains a power module, a capacitor and several circuit boards. In this connection, components such as the power module with heat generation may be disposed in a lower portion of the main body 20. The heatsink module 10 is coupled to a bottom of the main body 20. The main body 20 is supported by the heatsink module 10.

The supporter of the heatsink module for the inverter according to the first embodiment of the present disclosure is described.

FIG. 2 is a perspective view of a heatsink module for an inverter according to a first embodiment of the present disclosure. FIG. 3 is a schematic cross-sectional view showing an internal arrangement of the heatsink module for an inverter according to the first embodiment of the present disclosure. FIG. 4 is a cross-sectional view of a supporter of the heatsink module for an inverter according to the first embodiment of the present disclosure.

As shown in FIG. 2 to FIG. 4, the heatsink module 10 for the inverter according to the first embodiment of the present disclosure dissipates heat generated in the main body 20 to the surroundings. To this end, the heatsink module 10 includes a housing 100, a heat dissipation plate 200, and a supporter 300.

First, the housing 100 includes a bottom wall 110 and side walls 120 upwardly extending from both sides of the bottom face 110 so as to face away each other. A flange 122 extends from a top of each of the side walls 120.

The heat-dissipation plate 200 includes a base 210 coupled to the flanges 122 and a plurality of heat-dissipation fins 220 extending downwardly from a bottom of the base 210.

Further, the supporter 300 includes slots 320 that accommodate at least a portion of the heat-dissipation fins 220. The supporter 300 is interposed between a bottom face 110 of the housing 100 and the heat-dissipation fins 220.

Each of the components as described above is described in more detail below.

The housing 100 may be a casing having a bottom face 110 and at least two side walls 120. The housing 100 may further include a blowing fan 600 for forcibly circulating air at one end thereof. An air outlet (not shown) may be defined in the other end of the housing 100. The blowing fan 600 and the air outlet (not shown) may be configured such that air introduced into an inner space of the housing 100 passes through between the heat-dissipation fins 220 of the heat-dissipation plate 200 and is discharged to the outside through the outlet. The positions of the blowing fan 600 and the air outlet (not shown) may not be limited to one end or the other end of the housing 100.

Further, as shown in FIG. 2, the pair of side walls 120 is connected, at a bottom thereof, to the bottom face 110 of the housing 100. Thus, the bottom face 110 and the pair of side walls 120 may define a space having three faces.

The flange 122 extends horizontally from a top of each of the side walls 120. Each side wall 120 may be folded to extend vertically such that both side walls 120 face away each other. The flange 122 may be folded to extend horizontally from the top of each of the side walls 120. The flange 122 may include a fastener hole. The flange 122 and base 210 may be coupled to each other via a fastener which is inserted into the hole. The fastener may be embodied as a bolt. However, the fastener is not limited to particular means.

As shown in FIG. 3, the housing 100 may have a hexahedron structure having an open top and two open lateral faces. The blowing fan 600 may be disposed in one of the two open lateral faces of the housing 100. When the blowing fan 600 operates, air flows into the housing 100 from the outside of the housing 100. The introduced air passes through between the heat-dissipation fins 220 of the heat-dissipation plate 200. Thus, the heat-dissipation fins 220 emits heat towards the air passing therebetween.

Further, fixed rails 112 may be formed on the bottom face 110 of the housing 100. Each fixed rail 112 is engaged with each rail groove 310 defined in the supporter 300, which will be described later.

Each fixed rail 112 may extend between the pair of side walls 120 and may protrude from the bottom face 110 by a predetermined height. Each fixed rail 112 has a shape corresponding to a shape of each rail groove 310 of the supporter 300. The fixed rail 112 may be press-fitted into the rail groove 310. While the fixed rail 112 and the rail groove 310 are engaged with each other, the movement direction of the supporter 300 is restricted to a direction of an extension of the fixed rail 112.

The heat-dissipation plate 200 is made of a material having a high thermal conductivity. The heat-dissipation plate 200 includes the base 210 and heat-dissipation fins 220.

The base 210 has a top flat face. The flat top face is joined to each flange 122 of the side wall 120. When the heatsink module 10 is coupled to the main body 20, the flat top face of the base 210 is exposed upwardly of the housing 100. The top face of the base 210 is in contact with the bottom of the main body 20 to absorb heat generated from the main body 20.

The heat-dissipation fins 220 may be integrally formed with the base 210. The heat-dissipation fins 220 is coupled to the bottom face of the base 210.

As shown in FIG. 2, the heat-dissipation fins 220 may be embodied as plate-like members and may be spacedly arranged at a predetermined spacing.

The base 210 absorbs heat from the main body 20 and conducts the heat to the heat-dissipation fins 220. The heat-dissipation fins 220 have a relatively large area in contact with the air introduced by the blowing fan 600 into the housing 100, thereby to radiate the heat toward flowing surrounding air to dissipate the heat.

While the base 210 is coupled to each flange 122, the heat-dissipation fins 220 are disposed in the inner space of the housing 100. A bottom of the heat-dissipation fins 220 are spaced a predetermined distance from the bottom face 110 of the housing 100.

The supporter 300 is inserted into a space between the bottom of the heat-dissipation fins 220 and the bottom face 110 of the housing 100. The supporter 300 has a length corresponding to a width of the heat-dissipation fins 220. Each rail groove 310 having a shape corresponding to a shape of each fixed rail 112 is defined in the bottom of the supporter 300. The rail groove 310 may have a predetermined length along a length direction of the supporter 300. The rail groove 310 may have the same length as a length of the fixed rail 112 or may be longer than the fixed rail 112. A horizontal dimension of the rail groove 310 is smaller than a horizontal dimension of the fixed rail 112. Thus, the fixed rail 112 is press-fitted into the rail groove 310. Thus, the supporter 300 is fixed to the bottom face 110 of the housing 100.

As shown in FIG. 4, a guide surface 340 defines a portion of an outer face of the supporter 300 and is inclined upwardly from the bottom face 110 at a predetermined angle with respect to a horizontal face. The guide surface 340 reduces resistance of air moving toward the supporter 300, thereby making the air flow smoother.

Further, an upper portion of the supporter 300d has an elastic portion 330 downstream of the guide surface 340 in terms of an air flow direction.

The supporter 300 may be monolithic. In one example, an entirety of the supporter 300 may be made of an resilient material. However, only the elastic portion 330 may be formed of a material having elasticity.

The elastic portion 330 has the slots 320 defined in a rear thereof in terms of the air flow direction. The slots may be arranged in the length direction of the supporter 300. The slots 320 respectively accommodate lower ends of the heat-dissipation fins 220 as plurality of plate members. Thus, a spacing between and the number of slots 320 correspond to a spacing between and the number of the heat-dissipation fins 220.

The supporter 300 is coupled to the bottom face 110 of the housing 100 when the fixed rail 112 is press-fitted into the rail groove 310. The supporter 300 is interposed between the bottom face 110 of the housing 100 and the bottoms of the heat-dissipation fins 220 while the slots 320 accommodate the bottom portions of the heat-dissipation fins 220 respectively. The elastic portion 330 of the supporter 300 resiliently supports the slots 320 while being disposed between the rail groove 310 and the slots 320 such that the slots 320 presses the heat-dissipation fins 220.

A supporter of the heatsink module for the inverter according to a second embodiment of the present disclosure is described.

FIG. 5 is a perspective view and a side elevation view showing a supporter of a heatsink module for an inverter according to a second embodiment of the present disclosure.

As shown in FIG. 5, a supporter 300a according to the second embodiment of the present disclosure has the same configuration as the supporter 300 as described above in the first embodiment except for an elastic portion 330.

Specifically, the supporter 300a according to the second embodiment of the present disclosure includes a rail groove 310a and slots 320a. The rail groove 310a is press-engaged with the fixed rail 112 formed on the bottom face 110. The rail groove 310a is formed in a straight line of a predetermined length. The fixed rail 112 is received in the rail groove 310a along the length direction. In this connection, the straight line defining the rail groove 310a is perpendicular to an extension direction of each slot 320a. Due to this configuration, a direction in which each heat dissipation fin 220 is inserted to each slot 320a is perpendicular to a direction in which the rail is inserted into the rail groove 310a. Thus, the supporter 300a according to the second embodiment of the present disclosure may receive, through the slots 320a, the maximum number of heat-dissipation fins 220 per unit length.

A supporter 400 according to a third embodiment of the present disclosure is described.

FIG. 6 is a perspective view a state in which a supporter is coupled to a heatsink module for an inverter according to a third embodiment of the present disclosure. FIG. 7 is a perspective view of the supporter in the heatsink module for an inverter according to the third embodiment of the present disclosure.

As shown in FIG. 6 and FIG. 7, the supporter 400 extends between the pair of side walls 120. The supporter 400 has a concave curved top face. Thus, the supporter 400 has a smallest height at a longitudinal center thereof.

The supporter 400 includes a plurality of slots 420 into which the heat-dissipation fins 220 are accommodated respectively. Further, the supporter 400 has a rail groove 410 for receiving a fixed rail 112 formed on the bottom face 110 of the housing 100.

An elastic portion 430 having a vertical dimension may be formed between the rail groove 410 and the slot 420s and may be deformed due to an external force.

A supporter 400a of the heatsink module for an inverter according to a fourth embodiment of the present disclosure will be described.

FIG. 8 is a perspective view of a supporter in a heatsink module for an inverter according to a fourth embodiment of the present disclosure.

As shown in FIG. 8, a supporter 400a according to the fourth embodiment of the present disclosure has the same configuration as the supporter 400 of the third embodiment except for an elastic portion 430.

As shown in FIG. 8, the supporter 400a extends between the pair of side walls 120. The supporter 400a has a concave curved top face. Thus, the supporter 400a has a smallest height at a longitudinal center thereof.

The supporter 400a includes a plurality of slots 420a into which the heat-dissipation fins 220 are accommodated respectively. Further, the supporter 400a has a rail groove 410a for receiving the fixed rail 112 formed on the bottom face 110 of the housing 100.

The supporter 400a according to the fourth embodiment of the present disclosure is free of the elastic portion 430. Thus, the supporter 400a may be more firmly interposed between the heat-dissipation fins 220 and the housing 100, thereby reducing the vibration.

A supporter 500 of the heatsink module for an inverter according to a fifth embodiment of the present disclosure will be described.

FIG. 9 is a schematic cross-sectional view showing an internal arrangement of a heatsink module for an inverter according to a fifth embodiment of the present disclosure. FIG. 10 is a perspective view and a side elevation view of a supporter in the heatsink module for an inverter according to the fifth embodiment of the present disclosure.

Referring to FIG. 9 and FIG. 10, an outer shape of the supporter 500 according to the fifth embodiment of the present disclosure is elongate and is rectangular parallelepiped and has a predetermined length along a length direction of the fixed rail 112. A rail groove 510 is defined in a bottom of the supporter 500. The rail groove 510 accommodates the fixed rail 112. The bottom of the supporter 500 is spaced a predetermined height from the bottom face 110. That is, the supporter 500 is supported by the fixed rail 112 and maintains a predetermined gap with the bottom face 110.

Slots 520 are defined in a top of the supporter 500 and are arranged at a regular spacing. The slot 520 accommodate the heat-dissipation fins 220 respectively.

FIG. 11 is a front view of a conventional heatsink module showing a vibration state of the conventional heatsink module. FIG. 12 is a front view of a heatsink module for an inverter according to the present disclosure.

As shown in FIG. 11, in the conventional heatsink module, bottoms of the heat-dissipation fins 220 is spaced by a certain distance from the bottom face of the housing 100. Accordingly, when vibration occurs from the power module or the main body 20 which is in contact with the base 210, the bottoms of the heat-dissipation fins 220 vibrate. As the heat-dissipation fins 220 vibrate, noise is generated. Further, the heat-dissipation fins 220 may partially contact the bottom face 110 of the housing 100.

Further, since the housing 100 is composed of the bottom face 110 and the both side walls 120, the side walls of the housing 100 may be deformed due to vibration.

However, as shown in FIG. 12, in the heatsink module according to the present disclosure, the bottoms of the heat-dissipation fin 220 are partially accommodated in the slots 320. The heat-dissipation fins 220 are pressed upwards by the elastic portion 330 of the supporter 300. Therefore, even when vibration occurs from the main body 200 or the power module that is in contact with the base 210, the bottoms of the heat-dissipation fins 220 may not vibrate.

Further, a spacing between the bottoms of the heat-dissipation fins 220 and the bottom face 110 is kept constant by the supporter 300. Therefore, even when vibration occurs from the main body 20 or the power module that is in contact with the base 210, the heat-dissipation fins 220 will not contact the bottom face 110.

Further, since the supporter 300 contacts the bottom face 110, the force transmitted to the side walls 120 of the housing 100 when vibrations occur from the main body 20 or the power module that is in contact with the base 210 may be dispersed by the supporter 300. Therefore, the possibility that the side walls 120 of the housing 100 may be deformed due to the vibration may be reduced.

According to the third embodiment of the present disclosure, a height of each of both ends of the supporter 400 is relatively larger than a height of the center thereof. Thus, the air moving toward the heat-dissipation fins 220 by the blowing fan 600 may not be dispersed but may be collected into a center portion across the heat-dissipation fins 220. Thus, a larger amount of air flows to the high-temperature center portion across the heat-dissipation fins 220 than in the prior art, thereby enhancing the heat-dissipating efficiency of the heat-dissipation fins 220.

Although the present disclosure has been described with reference to the drawings illustrating the present disclosure, the present disclosure is not limited to the embodiments and drawings disclosed in the present specification. It will be apparent that various modifications may be made by those skilled in the art within the scope of the present disclosure. In addition, it should be appreciated that effects to be achieved from configurations of the present disclosure as not expressly mentioned may be acknowledged.

What is claimed is:

1. A heatsink module for an inverter, wherein the heatsink module is configured to dissipate heat generated from a main body of the inverter, wherein the heatsink module comprises:
    a housing having:
        a bottom face;
        two spaced side walls vertically extending from two sides of the bottom face respectively; and
        two flanges horizontally and inwardly extending from top ends of the two spaced side walls, respectively;
    a heat-dissipation plate including:
        a base fixed to the two flanges; and
        a plurality of heat-dissipation fins extending downward from a bottom of the base; and
    a supporter interposed between the bottom face of the housing and the heat-dissipation fins, wherein the supporter has slots defined therein for accommodating at least portions of the heat-dissipation fins respectively,
    wherein a bottom of the heat-dissipation fins is spaced at a predetermined distance from the bottom face of the housing,
    wherein the supporter further includes a guide surface opposite to the slots and inclined at a predetermined angle, wherein a rail groove for engaging with the bottom face of the housing is formed along a length direction at a lower portion of the supporter corresponding between the guide surface and the slots,
    wherein a lower portion of the supporter corresponding to the guide surface is engaged to the bottom face of the housing, and a lower portion of the supporter corresponding to the slots is spaced from the bottom face of the housing by a predetermined distance.

2. The heatsink module of claim 1, wherein a fixed rail is formed on the bottom face of the housing, wherein the fixed rail is engaged with the supporter to restrict a movement of the supporter.

3. The heatsink module of claim 2, wherein the rail groove is defined in a bottom of the supporter, wherein the rail groove has a shape corresponding to a shape of the fixed rail such that the fixed rail is press-fitted into the rail groove.

4. The heatsink module of claim 3, wherein the supporter further includes an elastic portion formed between the rail groove and the slots and made of an elastic material,
    wherein when the heat-dissipation fins are engaged with the slots, the elastic portion elastically supports the slots so that the slots presses the heat-dissipation fins.

5. The heatsink module of claim 1, wherein the supporter has a concave curved top face such that a height thereof gradually increases from a longitudinal center thereof to each of both longitudinal ends thereof.

* * * * *